(12) United States Patent
Kumar

(10) Patent No.: US 9,165,642 B2
(45) Date of Patent: Oct. 20, 2015

(54) LOW VOLTAGE DUAL SUPPLY MEMORY CELL WITH TWO WORD LINES AND ACTIVATION CIRCUITRY

(71) Applicant: STMicroelectronics International N.V., Amsterdam (NL)

(72) Inventor: Shishir Kumar, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 179 days.

(21) Appl. No.: 13/746,395

(22) Filed: Jan. 22, 2013

(65) Prior Publication Data

US 2014/0204656 A1      Jul. 24, 2014

(51) Int. Cl.
| | | |
|---|---|---|
| G11C 11/00 | (2006.01) | |
| G11C 11/419 | (2006.01) | |
| G11C 8/08 | (2006.01) | |
| G11C 11/418 | (2006.01) | |

(52) U.S. Cl.
CPC ............... *G11C 11/419* (2013.01); *G11C 8/08* (2013.01); *G11C 11/418* (2013.01)

(58) Field of Classification Search
CPC ....... G11C 11/419; G11C 8/08; G11C 11/418
USPC .................. 365/154, 49.1, 49.17, 156, 233.1, 365/233.11, 233.19
See application file for complete search history.

(56) References Cited

U.S. PATENT DOCUMENTS

| | | | | |
|---|---|---|---|---|
| 5,289,432 | A | * | 2/1994 | Dhong et al. ............ 365/230.05 |
| 5,668,761 | A |   | 9/1997 | Muhich et al. |
| 5,673,230 | A | * | 9/1997 | Kuriyama ..................... 365/203 |
| 6,606,275 | B2 | * | 8/2003 | Shau .............................. 365/63 |
| 6,898,111 | B2 |   | 5/2005 | Yamauchi |
| 7,271,451 | B2 | * | 9/2007 | Liaw ............................ 257/369 |
| 7,355,905 | B2 | * | 4/2008 | Campbell et al. ........ 365/189.11 |
| 7,834,662 | B2 | * | 11/2010 | Campbell et al. .............. 326/68 |
| 7,894,280 | B2 | * | 2/2011 | Houston .................. 365/189.14 |
| 8,194,478 | B2 |   | 6/2012 | Yang et al. |
| 8,760,958 | B2 | * | 6/2014 | Iyer et al. ................. 365/230.05 |
| 2007/0030722 | A1 | * | 2/2007 | Chanussot et al. ............ 365/154 |
| 2008/0043561 | A1 | * | 2/2008 | Wang et al. .................... 365/227 |
| 2013/0051170 | A1 | * | 2/2013 | Kuroda .......................... 365/207 |

* cited by examiner

*Primary Examiner* — Tha-O H Bui
(74) *Attorney, Agent, or Firm* — Gardere Wynne Sewell LLP

(57) ABSTRACT

A memory cell includes a latch having a true data node and a complement data node, a true bitline, a complement bitline, a first access transistor coupled between the true bitline and the true data node, and a second access transistor coupled between the complement bitline and the complement data node. A wordline driver circuit includes a true wordline coupled to control the first access transistor and a complement wordline coupled to control the second access transistor. The wordline driver generates control signals on the true and complement wordlines to access the memory cell by: actuating the first access transistor while the second access transistor is not actuated and then actuating the second access transistor while the first access transistor is not actuated. The bitlines and wordlines are supplied from different sets of power supply voltages, with the bitline high supply voltage being less than the wordline high supply voltage.

21 Claims, 5 Drawing Sheets

LOW VOLTAGE DUAL SUPPLY MEMORY CELL WITH TWO WORD LINES AND ACTIVATION CIRCUITRY

TECHNICAL FIELD

The present invention relates to integrated memory circuits and in particular to a static random access memory (SRAM) cell integrated circuit.

BACKGROUND

Reference is made to FIG. 1 which shows a schematic diagram of a standard six transistor (6T) static random access memory (SRAM) cell 10. The cell 10 includes two cross-coupled CMOS inverters 12 and 14, each inverter including a series connected p-channel and n-channel MOSFET transistor pair. The inputs and outputs of the inverters 12 and 14 are coupled to form a latch circuit having a true data storage node Q and a complement data storage node QB. The cell 10 further includes two transfer (passgate) transistors $M_5$ and $M_6$ whose gate terminals are coupled with a wordline node and are controlled by the signal present at the wordline node (WL). Transistor $M_5$ is source-drain connected between the true data storage node Q and a node associated with a true bitline (BLT). Transistor $M_6$ is source-drain connected between the complement data storage node QB and a node associated with a complement bitline (BLF). The source terminals of the p-channel transistors $M_2$ and $M_4$ in each inverter 12 and 14 are coupled to receive a high supply voltage (for example, Vdd) at a high supply node, while the source terminals of the n-channel transistors $M_1$ and $M_3$ in each inverter 12 and 14 are coupled to receive a low supply voltage (for example, Gnd) at a low supply node. The high supply voltage Vdd at the high supply node and the low supply voltage Gnd at the low supply node comprise the power supply set of voltages for the cell 10.

The gate terminals of the transfer (passgate) transistors $M_5$ and $M_6$ are coupled to a wordline driver circuit 16 through the wordline node WL. The wordline driver circuit 16 is also coupled to receive the high supply voltage (Vdd) at the high supply node.

The true and complement bitlines BLT and BLF are coupled to bitline circuitry 18. The bitline circuitry 18 may comprise, for example, precharge circuitry, sense amplifier circuitry and read/write driver circuitry as known to those skilled in the art. The bitline circuitry 18 is also coupled to receive the high supply voltage (Vdd) at the high supply node.

Reference is now made to FIG. 2 which illustrates a block diagram of a memory device 20 including a plurality of cells 10 like that shown in FIG. 1 arranged in a matrix of rows and columns. The bit lines BLT/BLF of a plurality of cells 10 in a column are coupled together and to the bitline circuitry 18. The wordlines WL of a plurality of cells 10 in a row are coupled together and to the wordline driver circuit 16. The memory device 20 may further include additional circuitry, known to those skilled in the art but not shown in FIG. 2, including address decoder circuitry and input/output circuitry.

With the prior art configuration of FIGS. 1 and 2, a single power supply set of voltages (Vdd, Gnd) is accordingly used for the cell supply, WL high voltage and BLT/BLF high voltage. In stand-by mode, WL=Gnd, BLT/BLF=Vdd. In read mode, the WL transitions to Vdd, and BLT/BLF are left floating. In an exemplary read operation, the transfer (passgate) transistors $M_5$ and $M_6$ are simultaneously actuated through the wordline WL and a current flows from the bitline to ground through transistors $M_1$ and $M_5$. A rise in voltage is observed at the true data storage node Q having a value which depends on the strength of the transistors $M_1$ and $M_5$. An excess rise in the voltage at the true data storage node Q can turn transistor $M_3$ on causing cell data to be flipped to the opposite value. This condition is referred to in the art as read instability.

Local mismatch plays an important role in cell stability. Furthermore, it is known to those skilled in the art that the effect of mismatch increases as the supply voltage Vdd is lowered. Each cell design is qualified down to a lowest supply voltage Vdd(min) at which the cell stability meets a qualification target. The value of Vdd(min) accordingly acts as a restriction on low voltage functionality of the memory cell when used alone or when integrated with other components and circuits.

There is a need in the art to provide a memory cell suitable for stable operation in integrated circuit configurations that utilize low supply voltage levels.

SUMMARY

In an embodiment, a circuit comprises: a memory cell having a latch circuit with a true data storage node and a complement data storage node; a true bitline; a complement bitline; a first access transistor coupled between the true bitline and the true data storage node; a second access transistor coupled between the complement bitline and the complement data storage node; bitline circuitry coupled to the true and complement bitlines, said bitline circuitry powered from a first set of power supply voltages including a first high supply voltage; and a wordline driver circuit including a true wordline coupled to a control terminal of the first access transistor and a complement wordline coupled to a control terminal of the second access transistor, said wordline driver powered from a second set of power supply voltages including a second high supply voltage that is less than the first high supply voltage.

In an embodiment, a method comprises: accessing a memory cell having a latch circuit with a true data storage node and a complement data storage node, a first access transistor coupled between a true bitline and the true data storage node, and a second access transistor coupled between a complement bitline and the complement data storage node; wherein accessing comprises: first actuating the first access transistor while the second access transistor is not actuated; and followed by second actuating the second access transistor while the first access transistor is not actuated.

In an embodiment, a circuit comprises: a memory cell having a latch circuit with a true data storage node and a complement data storage node; a true bitline; a complement bitline; a first access transistor coupled between the true bitline and the true data storage node; a second access transistor coupled between the complement bitline and the complement data storage node; and a wordline driver circuit including a true wordline coupled to a control terminal of the first access transistor and a complement wordline coupled to a control terminal of the second access transistor, said wordline driver configured to generate signals on the true and complement wordlines to access the memory cell by: first actuating the first access transistor while the second access transistor is not actuated; and followed by second actuating the second access transistor while the first access transistor is not actuated.

BRIEF DESCRIPTION OF THE DRAWINGS

For a better understanding of the embodiments, reference will now be made by way of example only to the accompanying figures in which.

DETAILED DESCRIPTION OF THE INVENTION

Figure 1:
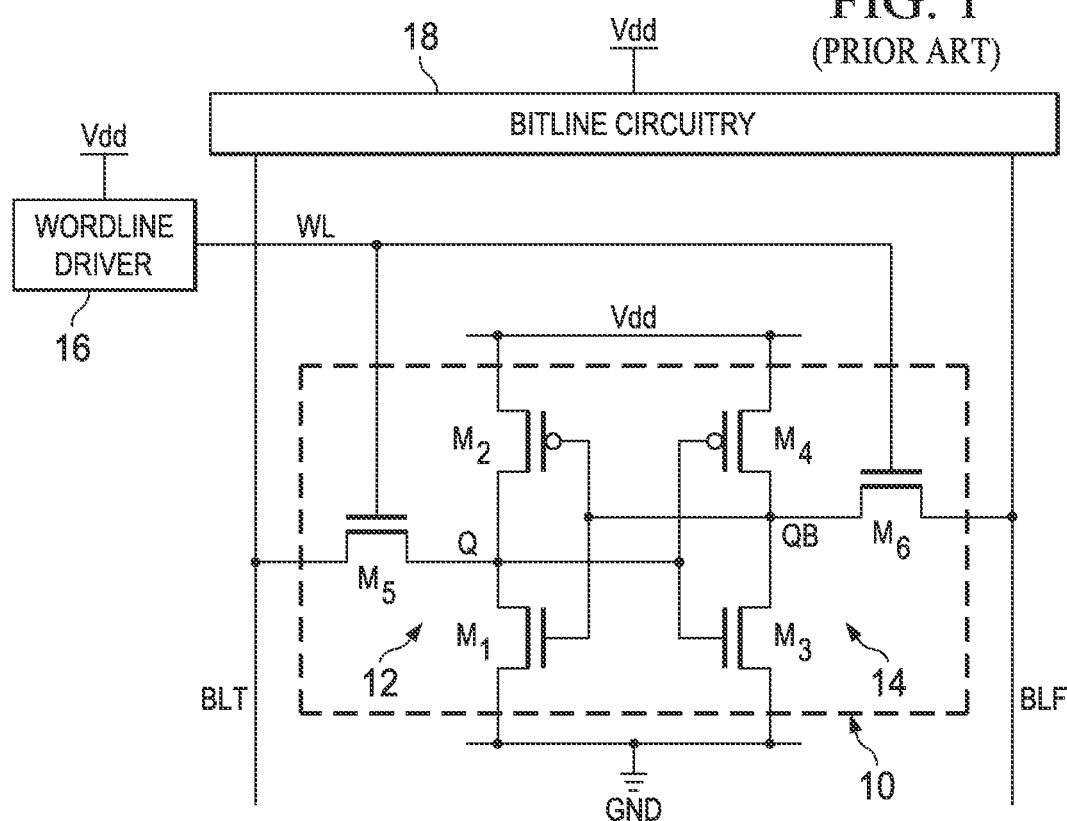
FIG. 1 is a schematic diagram of a standard six transistor static random access memory (SRAM) cell.
Figure 2:
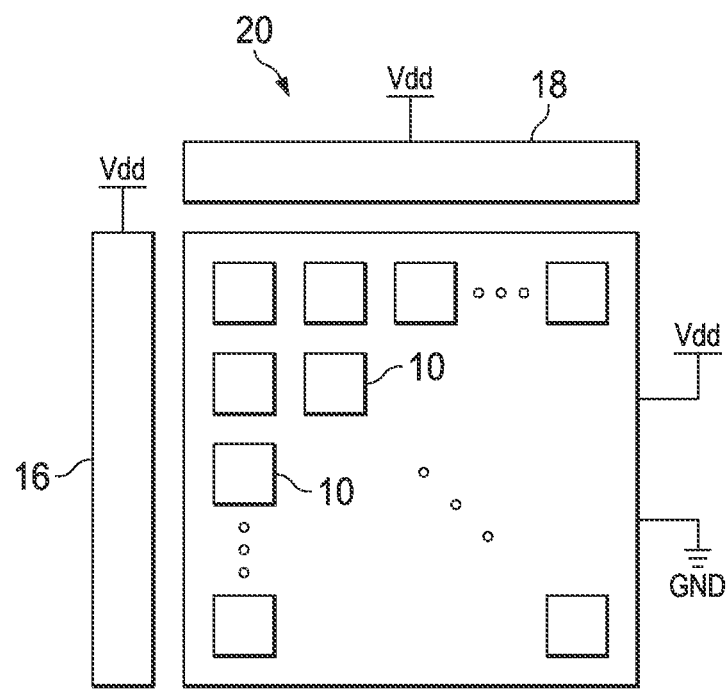
FIG. 2 is a block diagram showing a memory array include SRAM cells as in FIG. 1.

A number of circuit implementations are known in the art where a memory cell 10 (of FIG. 1) or memory circuit 20 is integrated with other circuitry. It is desirable in such implementations to operate the other circuitry at a low supply voltage, and indeed at a supply voltage which may be lower than the lowest supply voltage Vdd(min) at which the cell 10 is qualified for stable operation.

Figure 3:
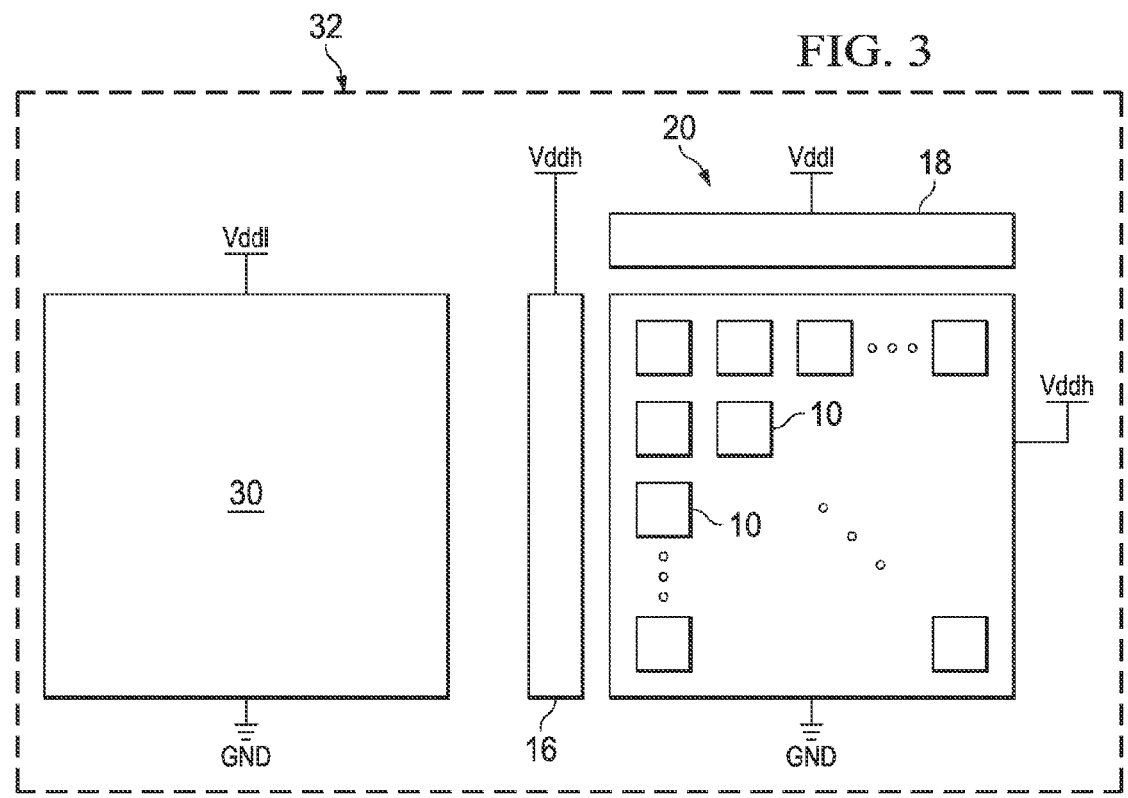
FIG. 3 is a block diagram showing an application specific integrated circuit including an array of SRAM cells as in FIG. 1 and a dual power supply.

Reference is now made to FIG. 3. The memory cell 10 may be integrated in a memory circuit 20 with other circuitry 30 in circuit 32, such as, for example, an application specific integrated circuit (ASIC). In this configuration, the non-memory circuitry 30 can be qualified for operation at a lower supply voltage than the lowest supply voltage Vdd(min) of the memory cell 10. The circuit 32 is accordingly provided with a dual supply including two power supply sets of voltages. A first power supply set of voltages includes a higher high supply voltage (Vddh) and low supply voltage (Gnd) and a second power supply set of voltages includes a lower high supply voltage (Vddl) and low supply voltage (Gnd).

To ensure operation of the memory cell above the lowest supply voltage Vdd(min), the first power supply set of voltages (Vddh and Gnd) are applied to the inverters 12 and 14 of each cell in the memory 20 and also to the wordline driver circuit 16, where Vddh>Vddmin. The second power supply set of voltages (Vddl and Gnd) are applied to the non-memory circuitry 30 and to the bitline circuitry 18, where Vddl<Vddmin.

With this configuration, the core logic of the circuit 32, for example represented by circuitry 30, may operate at a lower supply voltage while the memory cells 10 remain operable at a higher supply voltage. In order to ensure stability of operation, the higher high supply voltage Vddh cannot exceed the lower high supply voltage Vddl by more than the threshold voltage Vt of the transfer (passgate) transistors $M_5$ and $M_6$. As the difference between Vddh and Vddl moves closer to Vt, one of the transfer (passgate) transistors $M_5$ and $M_6$ begins to partially turn on during cell access operations and pull down on the corresponding data storage node Q or QB.

Figure 4:
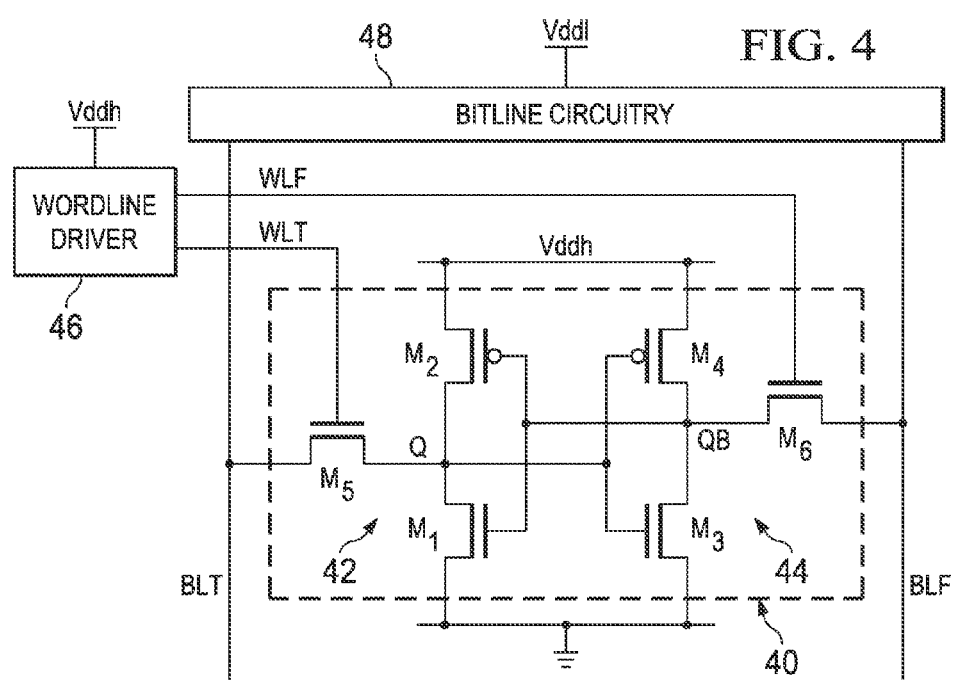
FIG. 4 is a schematic diagram of a six transistor static random access memory (SRAM) cell with a two word line configuration.

Reference is now made to FIG. 4 which illustrates a schematic diagram of a six transistor static random access memory (SRAM) cell 40 with two wordlines. The cell 40 includes two cross-coupled CMOS inverters 42 and 44, each inverter including a series connected p-channel and n-channel MOSFET transistor pair. The inputs and outputs of the inverters 42 and 44 are coupled to form a latch circuit having a true data storage node Q and a complement data storage node QB. The cell 40 further includes two transfer (passgate) transistors $M_5$ and $M_6$. The gate terminal of the transistor $M_5$ is coupled with a true wordline node and controlled by the signal present at the true wordline node (WLT). Transistor $M_5$ is source-drain connected between the true data storage node Q and a node associated with a true bitline (BLT). The gate terminal of the transistor $M_6$ is coupled with a complement wordline node and controlled by the signal present at the complement wordline node (WLF). Transistor $M_6$ is source-drain connected between the complement data storage node QB and a node associated with a complement bitline (BLF). The source terminals of the p-channel transistors $M_2$ and $M_4$ in each inverter 42 and 44 are coupled to receive a higher high supply voltage (for example, Vddh) at a high supply node, while the source terminals of the n-channel transistors $M_1$ and $M_3$ in each inverter 42 and 44 are coupled to receive a low supply voltage (for example, Gnd) at a low supply node. The higher high supply voltage Vddh at the high supply node and the low supply voltage Gnd at the low supply node comprise the first power supply set of voltages for the cell 40.

The gate terminals of the transfer (passgate) transistors $M_5$ and $M_6$ are coupled to a wordline driver circuit 46 through the wordline nodes WLT and WLF. The wordline driver circuit 46 is also coupled to receive the higher high supply voltage (Vddh) at the high supply node.

The true and complement bitlines BLT and BLF are coupled to bitline circuitry 48. The bitline circuitry 48 may comprise, for example, precharge circuitry, sense amplifier circuitry and read/write driver circuitry as known to those skilled in the art. The bitline circuitry 48 is coupled to receive a lower high supply voltage (Vddl) at the high supply node that is part of a second power supply set of voltages for the cell 40.

In a preferred embodiment, the memory cell 40 has a symmetric configuration as known in the art. It will be understood, however, that an asymmetric memory cell configuration could be used.

Figure 5:
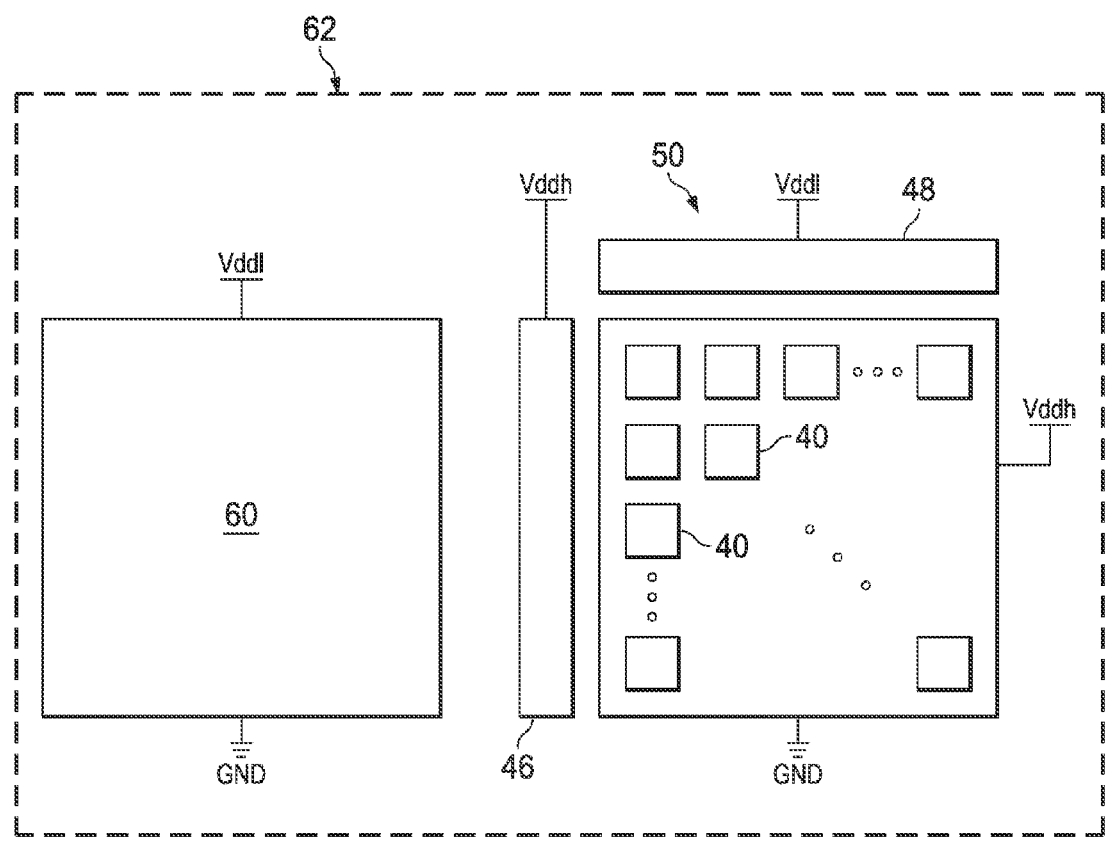
FIG. 5 is a block diagram showing an application specific integrated circuit including an array of SRAM cells as in FIG. 4.

Reference is now made to FIG. 5 which illustrates a block diagram of an integrated circuit 62, for example comprising an application specific integrated circuit (ASIC), that includes a memory device 50 including a plurality of cells 40 like that shown in FIG. 4 arranged in a matrix of rows and columns. The bit lines BLT/BLF of a plurality of cells 40 in a column are coupled together and to the bitline circuitry 48. The wordlines WLT/WLF of a plurality of cells 40 in a row are coupled together and to the wordline driver circuit 46. The memory device 50 may further include additional circuitry, known to those skilled in the art but not shown in FIG. 5, including address decoder circuitry and input/output circuitry.

The integrated circuit 62 further includes other circuitry 60 which may be coupled to interact with the memory device 50. The other circuitry 60 may comprise, for example, logic circuitry or processing circuitry (such as a processing core) which uses the memory device 50 to store data and/or programming.

The integrated circuit 62 is provided with a dual supply including two power supply sets of voltages. A first power supply set of voltages includes a higher high supply voltage (Vddh) and low supply voltage (Gnd) and a second power supply set of voltages includes the lower high supply voltage (Vddl) and low supply voltage (Gnd), wherein Vddh>Vddl. To ensure operation of the memory cell above the lowest supply voltage Vdd(min), the first power supply set of voltages (Vddh and Gnd) are applied to the inverters 42 and 44 of each cell 40 in the memory 50 and also to the wordline driver circuit 46, where Vddh>Vddmin. The second power supply set of voltages (Vddl and Gnd) are applied to the non-memory circuitry 60 and to the bitline circuitry 48, where Vddl<Vddmin.

The advantage of providing two wordlines WLT and WLF for each cell 40 of the memory 50 is that the two transfer (passgate) transistors $M_5$ and $M_6$ can be accessed and controlled independently.

Figure 6A:
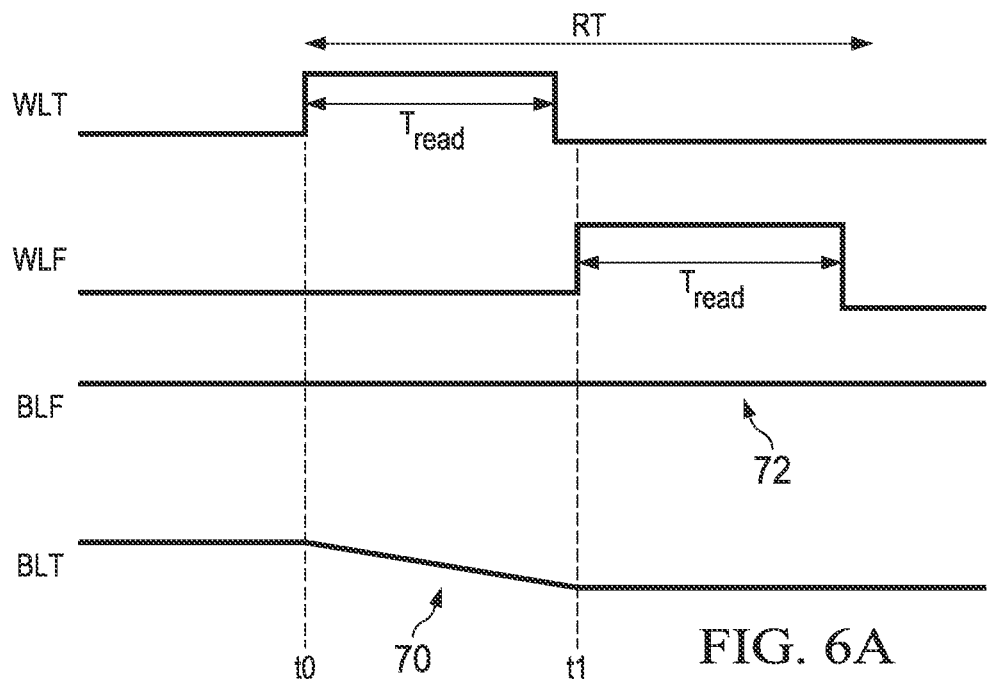
FIGS. 6A and 6B are timing diagrams illustrating a read operation with the SRAM cell of FIG. 4.

Reference is now made to FIG. 6A which illustrates a timing diagram for a read operation with the SRAM cell of FIG. 4. In FIG. 6A, it is assumed that the cell 40 is currently storing a logic low value (i.e., the true data storage node Q is logic low: for example, Q=Gnd). The wordline driver circuit 46—is configured to generate control signals on the two wordlines WLT and WLF in a multiplexed fashion. Specifically, at time t0, the wordline driver circuit 46 asserts the true wordline WLT to a logic high value associated with the higher high voltage value (i.e., WLT=Vddh) while deasserting the complement wordline WLF to a logic low value (i.e., WLF=Gnd). The bitlines BLT and BLF have previously been pre-charged to the lower high voltage value (i.e., BLT=Vddl; BLF=Vddl). Responsive to the logic high value for the true wordline WRT, the transfer (passgate) transistor M5 is turned on. Because the complement data storage node is logic high (i.e., QB=Vddh), the transistor M1 is also turned on. The true bitline BLT accordingly is coupled to ground (Gnd) through the transistors M1 and M5, an thus transitions 70 to logic low (BLT→Gnd). The complement bitline BLF remains at the lower high voltage value (BLF=Vddl).

The wordline driver circuit 46 holds the true wordline WLT at the logic high value associated with the higher high voltage value (i.e., WLT=Vddh) for a read time Tread whose length is sufficient to ensure completion of a transition of the true bitline BLT logic state.

Following expiration of the read time Tread, at time t1, the wordline driver circuit 46 asserts the complement wordline WLF to a logic high value associated with the higher high voltage value (i.e., WLF=Vddh) while deasserting the true wordline WLT to a logic low value (i.e., WLT=Gnd). Responsive to the logic high value for the complement wordline WRF, the transfer (passgate) transistor M6 is turned on. Because the true data storage node is logic low (i.e., Q=Gnd), the transistor M4 is also turned on. The complement bitline BLF accordingly is coupled to the higher high voltage value (Vddh) through the transistors M4 and M6, and thus maintains 72 a logic high state (BLF=Vdd). The true bitline BLT remains at the logic low value (BLT=Gnd).

The wordline driver circuit 46 holds the complement wordline WLF at the logic high value associated with the higher high voltage value (i.e., WLF=Vddh) for a read time Tread whose length is sufficient to ensure completion of a transition of the complement bitline BLF logic state.

The sequential assertion of the true and complement wordlines WRT and WRF as shown in FIG. 6A represents one read cycle RT for the memory cell 40.

Figure 6B:
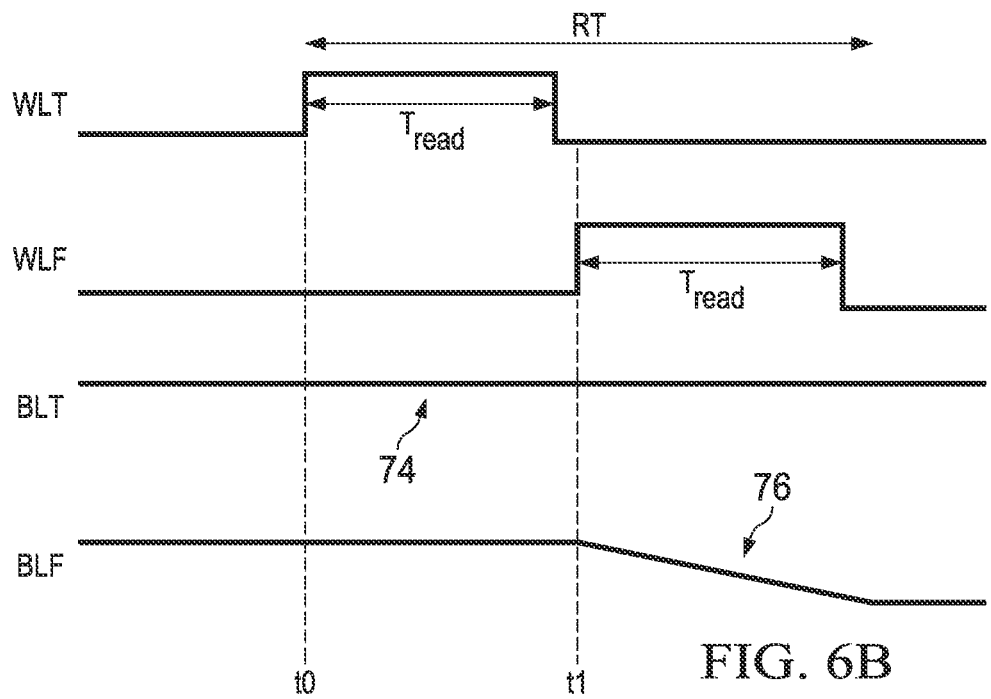

Reference is now made to FIG. 6B which illustrates a timing diagram for a read operation with the SRAM cell of FIG. 4. In FIG. 6B, it is assumed that the cell 40 is currently storing a logic high value (i.e., the true data storage node Q is logic high: for example, Q=Vddh). The wordline driver circuit 46 is configured to generate control signals on the two wordlines WLT and WLF in a multiplexed fashion. Specifically, at time t0, the wordline driver circuit 46 asserts the true wordline WLT to a logic high value associated with the higher high voltage value (i.e., WLT=Vddh) while deasserting the complement wordline WLF to a logic low value (i.e., WLF=Gnd). The bitlines BLT and BLF have previously been pre-charged to the lower high voltage value (i.e., BLT=Vddl; BLF=Vddl). Responsive to the logic high value for the true wordline WRT, the transfer (passgate) transistor M5 is turned on. Because the complement data storage node QB is logic low (i.e., QB=Gnd), the transistor M2 is also turned on. The true bitline BLT accordingly is coupled to the higher high voltage value (Vddh) through the transistors M2 and M5, and thus maintains 74 a logic high state (BLT=Vdd). The complement bitline BLF remains at the precharged logic high value (BLF=Vddl). The true bitline BLT also remains at the pre-charged logic high value (BLT=Vddl).

The wordline driver circuit 46 holds the true wordline WLT at the logic high value associated with the higher high voltage value (i.e., WLT=Vddh) for a read time Tread whose length is sufficient to ensure completion of a transition of the true bitline BLT logic state.

Following expiration of the read time Tread, at time t1, the wordline driver circuit 46 asserts the complement wordline WLF to a logic high value associated with the higher high voltage value (i.e., WLF=Vddh) while deasserting the true wordline WLT to a logic low value (i.e., WLT=Gnd). Responsive to the logic high value for the complement wordline WRF, the transfer (passgate) transistor M6 is turned on. Because the true data storage node is logic high (i.e., Q=Vddh), the transistor M3 is also turned on. The complement bitline BLF accordingly is coupled to ground (Gnd) through the transistors M3 and M6, and thus transitions 76 to logic low (BLF→Gnd). The true bitline BLT remains at the lower high voltage value (BLF=Vddl).

The wordline driver circuit 46 holds the complement wordline WLF at the logic high value associated with the higher high voltage value (i.e., WLF=Vddh) for a read time Tread whose length is sufficient to ensure completion of a transition of the complement bitline BLF logic state.

The sequential assertion of the true and complement wordlines WRT and WRF as shown in FIG. 6B represents one read cycle RT for the memory cell 40.

The advantage of separate activation of the two transfer (passgate) transistors $M_5$ and $M_6$ may be best understood by considering a specific example. When Vddh−Vddl is close to the threshold voltage Vt of transistor $M_6$, then transistor $M_6$ will be partially on and actively trying to pull down the complement data storage node QB (when the cell 40 stores a logic low; i.e., Q=Gnd and QB=Vddh). Because the true data storage node is logic low, transistor $M_4$ is turned on and fights against the transistor $M_6$ pull down. The lowest supply voltage Vdd(min) is dictated by this fight. If transistor $M_5$ were on (as would be the case with the single wordline implementation of FIG. 1), the voltage at the true data storage node Q will be slightly above ground and because the node Q is connected to the gate of transistor $M_4$, the pullup provided by transistor $M_4$ is weakened in the single word line configuration. With separate wordlines WLT and WRF as in FIG. 4, transistor $M_5$ can be controlled to be turned off when transistor $M_6$ is controlled to be turned on. With transistor $M_5$ off, the voltage at the true data storage node is assured to be fully logic low (Q=Gnd) and thus transistor $M_4$ will not be weakened so as to more effectively pull up on the complement data storage node QB.

Figure 7:
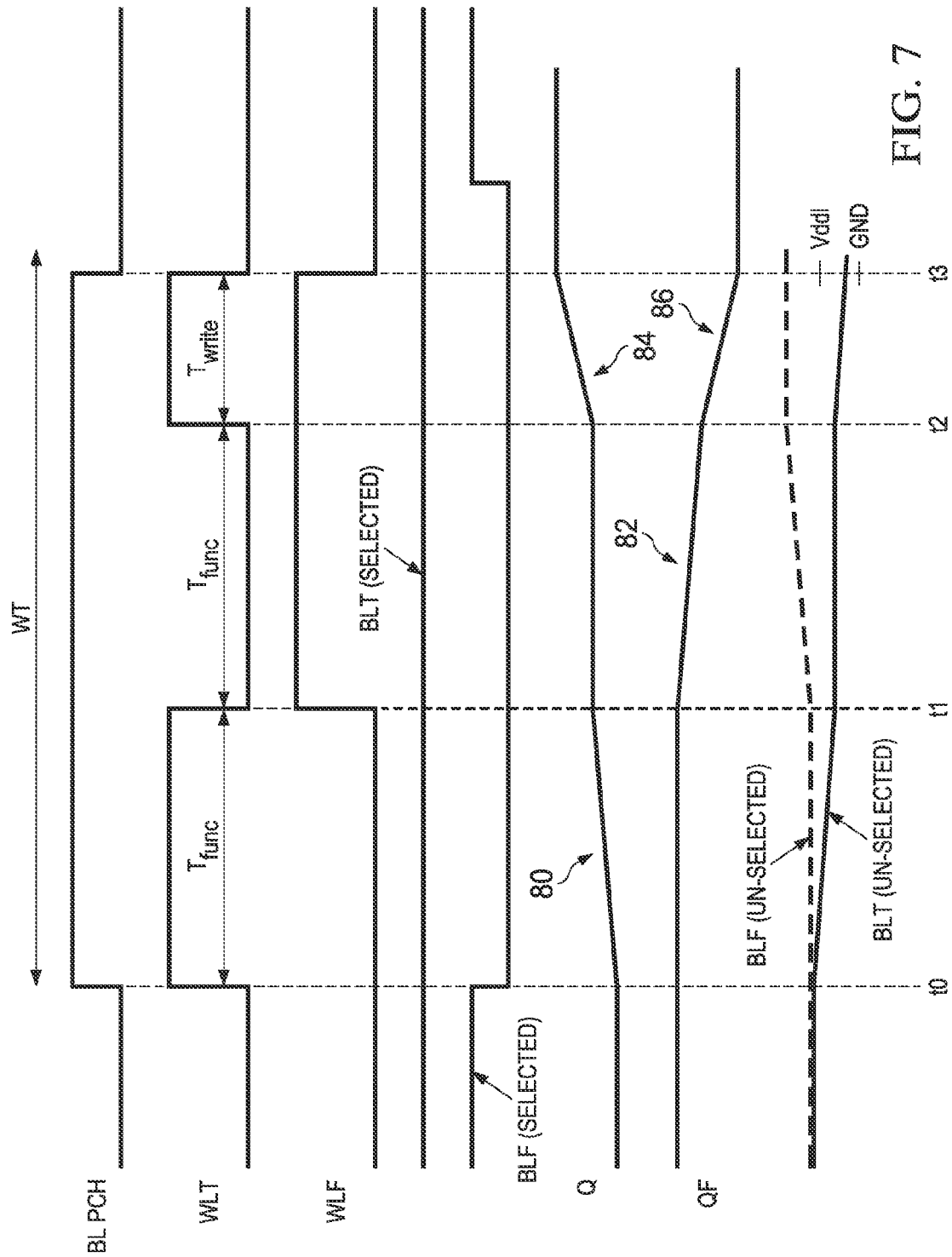
FIG. 7 is a timing diagram illustrating a write operation with the SRAM cell of FIG. 4.

Reference is now made to FIG. 7 which illustrates a timing diagram for a write operation with the SRAM cell of FIG. 4.

For an implementation where the column mux>1, or if there is a bit-write condition supported, there will exist one or more unselected columns where a write is not activated. The cells in those unselected columns (referred to as half-selected cells) which lie on an activated row will see a read disturbance and must be protected against a possible flip in data state. In FIG. 7, it is assumed that the half-selected cell 40 is currently storing a logic low value (i.e., the true data storage node Q is logic low: for example, Q=Gnd and QB=Vddh), and a write operation to a selected cell in the same row is being made to store a logic high value in the selected cell.

The signal PCH is the pre-charge control signal which is applied to cause the bitlines to be pre-charged to the Vddl level prior to the write operation.

The wordline driver circuit 46 is configured to generate control signals on the two wordlines WLT and WLF in a multiplexed fashion. Specifically, at time t0, the wordline driver circuit 46 asserts the true wordline WLT to a logic high value associated with the higher high voltage value (i.e., WLT=Vddh) while deasserting the complement wordline WLF to a logic low value (i.e., WLF=Gnd).

In the selected cell 40, the bitline circuitry 48 is in write mode and is asserting a logic high value on the true bitline (BLT (selected)=Vddl) and logic low value on the complement bitline (BLF (selected)=Gnd). In other words, the bitline circuitry is configured for writing a logic high value to the selected one of the cells 40. Responsive to the logic high value for the true wordline WRT, the transfer (passgate) transistor $M_5$ is turned on and the voltage at the true data storage node Q begins to rise (reference 80). However, the rise in voltage at the true data storage node Q is insufficient to change the state of the latch circuitry (inverters 42 and 44) so the logic high value on the complement data storage node remains (QB=Vddh).

In the half-selected cell 40, the value on the true bitline transitions towards logic low because the half-selected cell is storing a logic low value (BLT (unselected)→Gnd). The value on the complement bitline remains at the pre-charge level (BLF (unselected)=Vddl).

The wordline driver circuit 46 holds the true wordline WLT at the logic high value associated with the higher high voltage value (i.e., WLT=Vddh) for a functional time Tfunc whose length is sufficient to ensure a sufficient discharge of the true bitline BLT.

Following expiration of the functional time Tfunc, at time t1, the wordline driver circuit 46 asserts the complement wordline WLF to a logic high value associated with the higher high voltage value (i.e., WLF=Vddh) while deasserting the true wordline WLT to a logic low value (i.e., WLT=Gnd).

In the selected cell 40, responsive to the logic high value for the complement wordline WRF, the transfer (passgate) transistor $M_6$ is turned on and the voltage at the complement data storage node QB begins to decrease (reference 82). However, the decrease in voltage at the complement data storage node QB is insufficient to change the state of the latch circuitry (inverters 42 and 44) so the voltage at the true data storage node remains steady.

In the half-selected cell 40, the value on the complement bitline transitions towards logic high because the half-selected cell is storing a logic low value (BLF (unselected) Vdd). In this regard, the unselected complement bitline is charged through the transistors M4 and M6 when Vddh−Vddl>Vth_n. At time t2, the value on the unselected complement bitline is higher than the value on the unselected true bitline. This will ensure that the logic value of the half-selected cell remains stable during the completion of the write operation to the selected cell. A lower value (for example, <Vddl) of the unselected true bitline ensures a smaller rise on the true node Q which provides for better strength of the transistor M4. A higher value (for example, >Vddl) on the unselected complement bitline ensures smaller gate overdrive with respect to transistor M6.

The wordline driver circuit 46 holds the complement wordline WLF at the logic high value associated with the higher high voltage value (i.e., WLF=Vddh) for a functional time Tfunc whose length is sufficient to ensure a sufficient discharge of the complement bitline BLF.

Following expiration of the functional time Tfunc, at time t2, the wordline driver circuit 46 asserts the true wordline WLT to a logic high value associated with the higher high voltage value (i.e., WLT=Vddh) while asserting the complement wordline WLF at a logic high value associated with the higher high voltage value (i.e., WLF=Vddh). At this point in time, both of the transfer (passgate) transistors M5 and M6 are turned on. With transistor M5 turned on, and the true bitline BLT at logic high (BLT=Vddl), the voltage at the true data storage node Q continues to rise (reference 84). With transistor M6 turned on, and the complement bitline BLF at logic low (BLF=Gnd), the voltage at the complement data storage node QB continues to fall (reference 86). At some point the threshold voltages for the transistors in the latches 42 and 44 are overcome and the latch switches data state completing a write to memory cell 40 by driving the true data storage node Q to logic high (Vddh) and the complement data storage node QB to logic low (Gnd).

The wordline driver circuit 46 holds the true and complement wordlines WLT and WLF at the logic high value associated with the higher high voltage value (i.e., WLT=Vddh and WLF=Vddh) for a write time Twrite whose length is sufficient to ensure completion of the flipping of the latch circuit logic state. In a preferred implementation, the write time Twrite has a length which is less than the read time Tread. The write process ends at time t3.

The sequential assertion of the true and complement wordlines WRT and WRF as shown in FIG. 7 represents one write cycle WT for the memory cell 40.

It will be recognized that form a memory with a column mux=1, or with no bit write operation supported, there will be no unselected columns present in an activated row. Thus, the write operation will be enforced as to all columns across the row. In this memory configuration, the first two phases of the write operation shown in FIG. 7 which support the generation of control signals on the two wordlines WLT and WLF in a multiplexed fashion can be skipped and the write operation implemented directly in the manner shown by the third phase were both word lines are simultaneously asserted.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:
a memory cell having a latch circuit with a true data storage node and a complement data storage node;
a true bitline;
a complement bitline;
a first access transistor coupled between the true bitline and the true data storage node;
a second access transistor coupled between the complement bitline and the complement data storage node;
bitline circuitry coupled to the true and complement bitlines, said bitline circuitry powered from a first set of power supply voltages including a first high supply voltage; and a wordline driver circuit including a true wordline coupled to a control terminal of the first access transistor and a complement wordline coupled to a control terminal of the second access transistor, said wordline driver powered from a second set of power supply voltages including a second high supply voltage that is greater than the first high supply voltage;

wherein the wordline driver circuit is configured, when the memory cell is operable in a read mode, to implement in a single memory read cycle:
- a first time period which starts at a beginning of the single memory read cycle comprising actuation of the first access transistor while the second access transistor is simultaneously not actuated;
- followed immediately by a second time period comprising actuation of the second access transistor while the first access transistor is simultaneously not actuated which terminates at an end of the single memory read cycle.

2. The circuit of claim 1, comprising a plurality of said memory cells wherein said plurality of memory cells are arranged in a row and share said true and complement wordlines.

3. The circuit of claim 1, comprising a plurality of said memory cells wherein said plurality of memory cells are arranged in a column and share said true and complement bitlines.

4. The circuit of claim 1, wherein said memory cell is operable in a read mode to read data stored on the true and complement data storage nodes for output on said true and complement bitlines, respectively.

5. The circuit of claim 1, wherein in the first time period the wordline driver circuit is configured to assert the true wordline and deassert the complement wordline and wherein in the second time period the wordline driver circuit is configured to assert the complement wordline and deassert the true wordline.

6. The circuit of claim 1, wherein the memory cell is a static random access memory (SRAM) cell.

7. The circuit of claim 1, wherein said memory cell is operable in a write mode to write data from said true and complement bitlines for storage on the true and complement data storage nodes, respectively.

8. The circuit of claim 7, wherein the wordline driver circuit is configured, when the memory cell is operable in the write mode, to implement a write cycle comprising: a simultaneous actuation of the first and second access transistors.

9. A circuit, comprising:
- a memory cell having a latch circuit with a true data storage node and a complement data storage node;
- a true bitline;
- a complement bitline;
- a first access transistor coupled between the true bitline and the true data storage node;
- a second access transistor coupled between the complement bitline and the complement data storage node;
- bitline circuitry coupled to the true and complement bitlines, said bitline circuitry powered from a first set of power supply voltages including a first high supply voltage; and
- a wordline driver circuit including a true wordline coupled to a control terminal of the first access transistor and a complement wordline coupled to a control terminal of the second access transistor, said wordline driver powered from a second set of power supply voltages including a second high supply voltage that is greater than the first high supply voltage;

wherein the wordline driver circuit is configured, when the memory cell is operable in a write mode, to implement in a single memory write cycle:
- a first actuation of the first access transistor while the second access transistor is simultaneously not actuated;
- followed by a second actuation of the second access transistor while the first access transistor is simultaneously not actuated; and
- followed by a third actuation of both the first access transistor and second access transistor.

10. The circuit of claim 9, wherein in the third actuation the wordline driver circuit is configured to simultaneously assert the true wordline and the complement wordline.

11. The circuit of claim 9, wherein in the first actuation the wordline driver circuit is configured to assert the true wordline and deassert the complement wordline and wherein in the second actuation the wordline driver circuit is configured to assert the complement wordline and deassert the true wordline.

12. A method, comprising:
accessing a memory cell having a latch circuit with a true data storage node and a complement data storage node, a first access transistor coupled between a true bitline and the true data storage node, and a second access transistor coupled between a complement bitline and the complement data storage node;

wherein accessing is made in a read mode in a single memory access read cycle:
- actuating the first access transistor while the second access transistor is simultaneously not actuated during a first time period which starts at a beginning of the single memory read cycle; and
- immediately followed by actuating the second access transistor while the first access transistor is simultaneously not actuated during a second time period which terminates at an end of the single memory read cycle.

13. The method of claim 12, wherein accessing in the read mode operates to read data stored at the true and complement data storage nodes to the true and complement bit lines, respectively.

14. The method of claim 12, further comprising driving a true wordline coupled to a control terminal of the first access transistor and driving a complement wordline coupled to a control terminal of the second access transistor.

15. The method of claim 14, further comprising powering bitline circuitry coupled to the true and complement bitlines from a first set of power supply voltages including a first high supply voltage.

16. The method of claim 15, further comprising powering wordline driver circuitry configured to generate assertion signals on the true and complement wordlines from a second set of power supply voltages including a second high supply voltage that is greater than the first high supply voltage.

17. A method, comprising:
accessing a memory cell having a latch circuit with a true data storage node and a complement data storage node, a first access transistor coupled between a true bitline and the true data storage node, and a second access transistor coupled between a complement bitline and the complement data storage node;

wherein accessing is made in a write mode in a single memory access write cycle:
- first actuating the first access transistor while the second access transistor is simultaneously not actuated;

followed by second actuating the second access transistor while the first access transistor is simultaneously not actuated; and followed by third actuating both the first and second access transistors.

18. The method of claim 17, wherein accessing in the write mode operates to write data from the true and complement bit lines for storage at the true and complement data storage nodes, respectively.

19. The method of claim 17, further comprising driving a true wordline coupled to a control terminal of the first access transistor and driving a complement wordline coupled to a control terminal of the second access transistor.

20. The method of claim 19, further comprising powering bitline circuitry coupled to the true and complement bitlines from a first set of power supply voltages including a first high supply voltage.

21. The method of claim 20, further comprising powering wordline driver circuitry configured to generate assertion signals on the true and complement wordlines from a second set of power supply voltages including a second high supply voltage that is greater than the first high supply voltage.

* * * * *